(12) United States Patent
Lehman et al.

(10) Patent No.: US 6,697,396 B2
(45) Date of Patent: Feb. 24, 2004

(54) LASER LIGHT SOURCES HAVING INTEGRATED DETECTOR AND INTENSITY CONTROL AND METHODS OF PRODUCING SAME

(75) Inventors: John A. Lehman, Bedford, NH (US); Klein L. Johnson, St. Paul, MN (US); Bernard S. Fritz, Eagan, MN (US); Paul E. Bauhahn, Fridley, MN (US); Lynn M. Galarneau, Eagan, MN (US)

(73) Assignee: Honeywell International Inc., Morristown, NJ (US)

( * ) Notice: Subject to any disclaimer, the term of this patent is extended or adjusted under 35 U.S.C. 154(b) by 180 days.

(21) Appl. No.: 09/970,073

(22) Filed: Oct. 2, 2001

(65) Prior Publication Data

US 2003/0063634 A1 Apr. 3, 2003

(51) Int. Cl.[7] .................................................. H01S 3/10
(52) U.S. Cl. ...................................... 372/29.02; 372/31
(58) Field of Search ....................................... 372/29.02

(56) References Cited

U.S. PATENT DOCUMENTS

| | | | |
|---|---|---|---|
| 4,906,839 A | 3/1990 | Lee ............................ 250/239 |
| 5,123,024 A | 6/1992 | Dowd et al. ................... 372/38 |
| 5,239,189 A | 8/1993 | Lawrence ..................... 257/81 |
| 5,298,735 A | 3/1994 | Peterson et al. .......... 250/214.1 |
| 5,491,712 A | 2/1996 | Lin et al. ....................... 372/50 |
| 5,577,064 A | 11/1996 | Swirhun et al. ............... 372/96 |
| 5,631,987 A | 5/1997 | Lasky et al. ................... 385/88 |
| 5,648,979 A | 7/1997 | Mun et al. ..................... 372/50 |
| 5,757,836 A | 5/1998 | Jiang et al. .................... 372/50 |
| 5,761,229 A | 6/1998 | Baldwin et al. ............... 372/31 |
| 5,799,030 A | 8/1998 | Brenner ........................ 372/50 |
| 5,812,582 A | 9/1998 | Gilliland et al. ............... 372/50 |
| 6,037,644 A | 3/2000 | Daghighian et al. ......... 257/444 |
| 6,069,905 A | 5/2000 | Davis et al. ................... 385/31 |
| 6,081,638 A | 6/2000 | Zhou ............................ 372/43 |
| 6,377,592 B1 * | 4/2002 | Auracher et al. .............. 372/9 |

* cited by examiner

Primary Examiner—James Davie
(74) Attorney, Agent, or Firm—Andrew A. Abeyta

(57) ABSTRACT

A device to monitor light output from a light source, including a V-groove substrate with a reflective coating deposited on at least one surface, an optical fiber, a light source positioned so that an amount of the light emitted, which is less than 100%, enters the optical fiber, a light intensity or source detector positioned so that at least some of the light emitted from the light source, that did not enter the optical fiber impinges upon the light intensity detector, and feedback circuitry. A method of producing a device including the steps of coating a surface of a V-groove substrate with a reflective material, placing a light source in said V-groove substrate. A method of producing a device comprising the steps of coating a surface of a V-groove substrate with a reflective material, placing a light source in said V-groove substrate, placing a light intensity detector in said V-groove substrate, and placing a wave guide structure in said V-groove substrate wherein said reflective material, said light source, said detector and said wave guide structure are positioned in said V-groove substrate so that an amount of light emitted from said light source, which is less than 100%, enters said wave guide structure; and at least some of the light emitted from said light source, that did not enter said wave guide structure reflects from said reflective material and impinges upon said light intensity detector.

45 Claims, 2 Drawing Sheets

REFERENCE V

LASER LIGHT SOURCES HAVING INTEGRATED DETECTOR AND INTENSITY CONTROL AND METHODS OF PRODUCING SAME

FIELD OF THE INVENTION

The invention generally pertains to laser light sources. More particularly the invention pertains to vertical cavity surface emitting lasers (VCSELs), integrated with detectors to be used to monitor and control the intensity of the VCSEL, and methods for producing such devices.

BACKGROUND OF THE INVENTION

The electrical properties of lasers vary over time due to variance in manufacturing tolerances, environmental effects such as temperature or humidity and the age of the laser. Control of power output and bias conditions enhances performance of semiconductor lasers. Control of power output also allows relaxation of manufacturing tolerances, thus increasing the yield of useful devices. In fiber optic applications, the desired power output is the highest value consistent with eye safety and long-term reliability. It is common practice to monitor the output power of the laser and feedback a portion of the signal to circuitry that controls the operating conditions of the device. A critical requirement is that the ratio of the feedback signal to the coupled power output be constant. The problem arises in maintaining a relationship between the feedback and output that is linear for maintaining a constant proportional output under varying conditions of the VCSEL.

Davis, U.S. Pat. No. 6,069,905, which is incorporated herein by reference, offers one solution to this problem. Davis discloses a device to monitor laser output. This method uses a can package to house a partially reflective surface. The partially reflective surface is configured to direct some of the laser output through the surface to the optical fiber, and reflect the remainder of the laser output to a detector. The amount of light that is received at the detector can then be used to monitor the intensity of the laser and control its output. This approach is quite capable of monitoring and controlling the output of a single laser. However, this device can encounter problems if configured with an array of lasers, as the diverging light from other lasers could be captured by the wrong detector.

Zhou, U.S. Pat. No. 6,081,638 also offers a method of monitoring laser output with an integrated detector. Zhou discloses an optical fiber with a reflective coating on the cleaved end of the fiber. Most of the light that hits the end of the optical fiber enters the fiber, but some will be reflected off of the reflective coating. The device is configured in such a way that a detector monitors the reflected light. This device requires the optical fiber to be modified, which may not always be desirable.

As a result, there is a need for a device that can monitor and control laser output of lasers contained in an array without modifying the optical devices they feed.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

The invention offers a device for monitoring and controlling the output of light sources. The invention includes devices to monitor light output from a light source, one embodiment of which includes: a V-groove substrate with a reflective coating deposited on at least one surface; an optical fiber; a light source positioned so that an amount of the produced light, which is less than 100%, enters the optical fiber; a light intensity or source detector positioned so that at least some of the produced light from the light source, that did not enter the optical fiber impinges upon the light intensity detector; and feedback circuitry.

Preferably, the light intensity detector utilized is a semiconductor detector and more preferably is a PIN detector. Preferably, the device of the invention is arranged within an array of devices.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

It should be understood that the drawings are not necessarily to scale and that the embodiments are illustrated using graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PREFERRED EMBODIMENT

Figure 1:
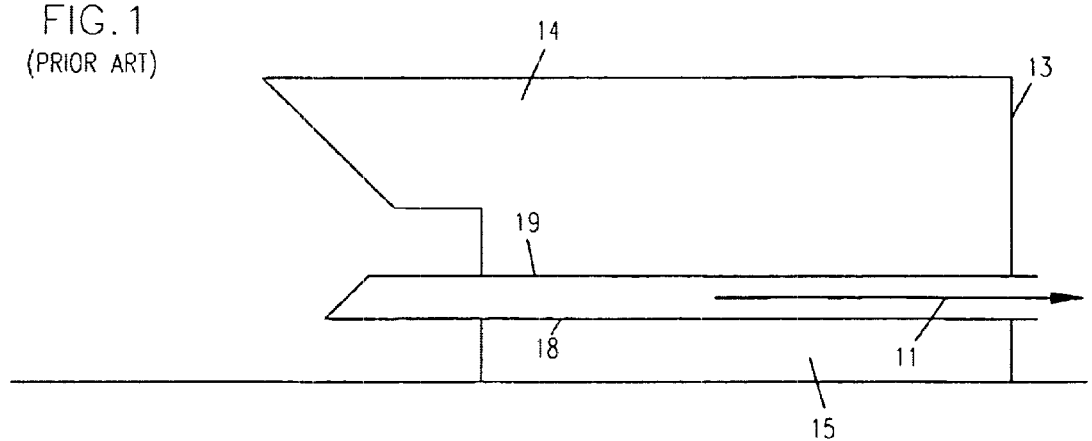
FIG. 1 depicts a vertical cross-section of a standard method of aligning optical fibers and light sources.

One standard method of aligning wave guide structures, such as optical fibers with their corresponding light source is known as V-groove alignment, and is depicted in FIG. 1. In V-groove alignment a V-groove assembly 13 is formed.

Figure 2:
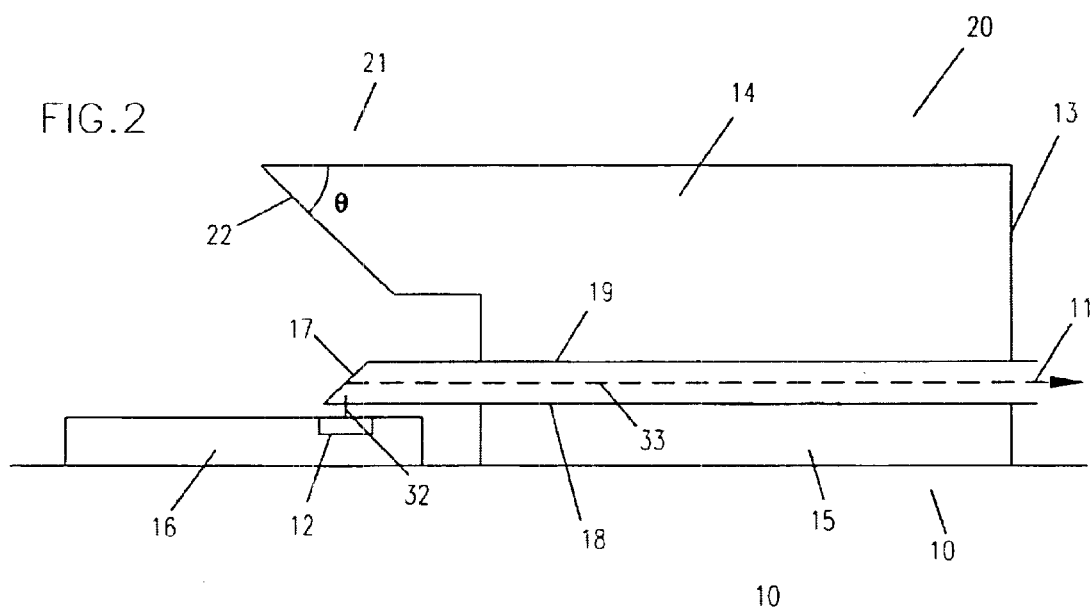
FIG. 2 is a cross-sectional view of a standard method of aligning optical fibers and light sources as utilized in accordance with one aspect of the invention.

Referring to FIG. 2, V-groove assembly 13 is situated on a packaging substrate 10. The V-groove assembly 13 contains a first substrate 15, preferably comprised of silicon and has etched in it a substantially "V" shaped groove 18 as shown in FIG. 1. The wave guide structure 11 is housed in the V-groove 18 of the first substrate 15. To maintain the position of the wave guide structure 11, a second substrate 14, again preferably comprising silicon, is configured with a similar V-groove 19 as shown in FIG. 1. The second substrate 14 is placed over the first substrate 15, which houses the wave guide structure 11 in its V-groove 18, so that the V-groove 19 of the second substrate 14 is directly over the wave guide structure 11.

The device of the invention uses this V-groove alignment method. FIG. 2 illustrates a V-groove assembly 13 as it is configured for use in the device of the invention. The first substrate 15 with an etched V-groove (not visible in FIG. 2) houses the wave guide structure 11. The second substrate 14 with an etched V-groove (not visible in FIG. 2) is positioned over the wave guide structure 11 and serves to maintain the position of the wave guide structure 11. The V-groove structure is also used to align wave guide structures 11 and light sources 12 in an array.

Wave guide structure 11 can comprise any wave guide structure. Examples of which include but are not limited to optical fibers, including optical glass or plastic, suitably implemented in a single-mode, multi-mode, or any other type of well-known optical fiber and polymer-based wave guides. When wave guide structure 11 is an optical fiber, the outer jacket that is typically provided with the optical fiber is suitably removed from the section of wave guide structure 11 interfacing with first and second substrate, 15 and 14. For simplicity, only the core of wave guide structure 11 is shown in the figures. This core can include several layers, e.g. an inner core with a high index of refraction and a surrounding outer cladding with a comparatively lower index of refraction. In the context of the invention, it is generally desirable to focus the bulk of emitted light from the light source 12 upon the inner core of the wave guide structure 11 when it is an optical fiber.

The wave guide structure 11 comprises a proximal end 17. The proximal end 17 of wave guide structure 11, if wave guide structure 11 is an optical fiber, is preferably fashioned into a suitable angle by polishing, cleaving, or the like. The particular angle is suitably selected such that light beam 32 from light source 12 will substantially impact upon the inner surface of the cleaved end 17 and will substantially reflect along the longitudinal axis of the wave guide 11, as depicted by the dashed line 33 shown in FIG. 2. Reflection of light into an optical fiber is further discussed in U.S. Pat. No. 5,163,113, which is incorporated herein by reference.

If wave guide structure 11 is an optical fiber and light source 12 is perpendicularly oriented with respect to the axis of the wave guide structure 11 and is below the proximal end 17 of wave guide structure 11, the angle of the cleave is suitably in the range of 30 to 60 degrees, and most preferably about 45 degrees, such that light moving vertically from the light source 12 below the wave guide structure 11 is deflected by about a 45 degree angle to travel horizontally along the axis of the wave guide 11. The particular angle selected can vary from implementation to implementation. However, the angle should preferably be selected to ensure that the light entering wave guide structure 11 is ultimately reflected to travel along the longitudinal axis of wave guide structure 11.

The second substrate 14 is configured so that it extends outwardly beyond the surface of the first substrate 15. The V-groove assembly 13 has a distal end 20 where the wave guide structure 11 enters the V-groove assembly 13 and a proximal end 21 where the wave guide structure 11 exits the V-groove assembly 13. The proximal end 21 of the V-groove assembly 13 is etched to form an angled surface 22 that is defined by the angle θ.

The device of the invention also comprises a light source 12. The light source 12 is housed in a third substrate 16, alternatively, third substrate 16 can be an extension of first substrate 15. The light source of the invention can be any type of semiconductor laser. Exemplary semiconductor lasers include both edge emitting lasers and surface emitting lasers. Preferably, the light source of the invention is a vertical cavity surface emitting laser (VCSEL). Examples of VCSEL laser chips that are suitable for use in the invention are available from the VCSEL Product division of Honeywell Inc. of Richardson, Tex.

Figure 3:
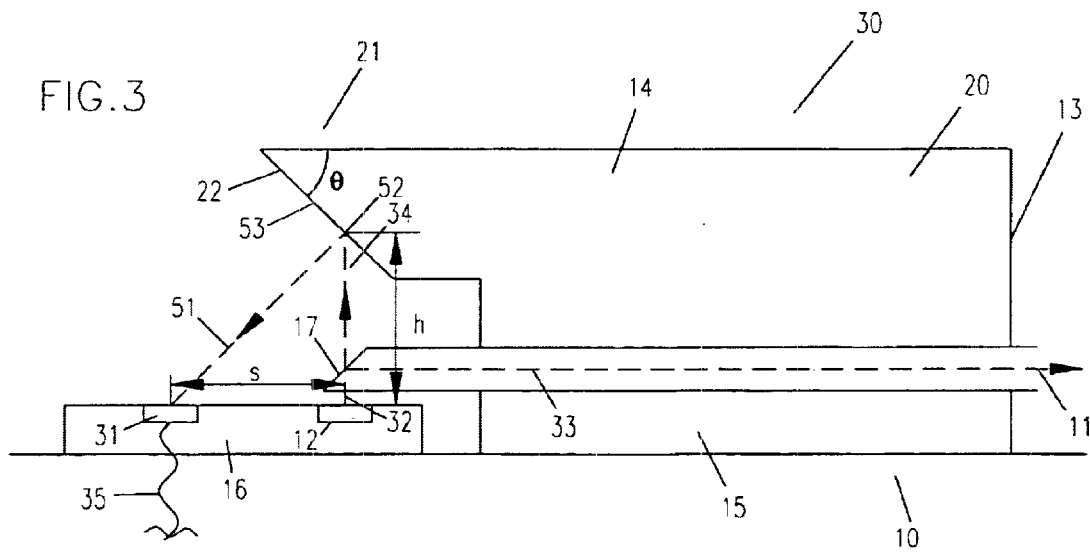
FIG. 3 is a schematic of the feedback electronics in accordance with one aspect of the invention.

FIG. 3 illustrates the operation of an embodiment of the device in accordance with one aspect of the invention. This embodiment of the device of the invention 50 uses the V-groove assembly 13 configured as illustrated and explained in FIG. 2 above. The light source 12 emits a beam of light 32 that is defined by the identity of the light source 12. As discussed above, the beam of light 32 will be partially reflected along the longitudinal axis of the wave guide structure 11 creating absorbed light beam 33. The remainder of the light beam 32 that does not become part of the absorbed light beam 33 becomes transmitted light beam 34. Transmitted light beam 34 continues on its path to contact the angled surface 22 of the proximal end 21 of the second substrate 14 of the V-groove assembly 13. The transmitted light beam 34 makes contact with angled surface 22 of the proximal end 21 of the second substrate 14 at the point of contact 52 Alternatively, the surface 22 could be parallel to the substrate 16.

The angle θ defined by the angled surface 22 and the surface of the second substrate 14 parallel to the wave guide structure 11 is given by the following equation, $$\theta = \frac{1}{2}\tan^{-1}\left(\frac{s}{h}\right)$$

where s, shown in FIG. 3, is the distance between the light source 12 and the point adjacent to the light source 12 where the beam is to be reflected (which is where the light source detector 31 is housed in this embodiment), and h, shown in FIG. 3, is the distance from the point of contact 52 to the surface of the light source 12.

The angled surface 22 in this embodiment of the invention has deposited on it a reflective coating 53. The reflective coating 53 can be created in a number of ways that are known to those of skill in the art, having read this specification. The reflective coating 53 can be produced from any metallic, reflective, thin film coating commonly used by those of skill in the art. Reflective coating 53 is preferably not polarization sensitive, and has a minimum angular sensitivity. Materials useful as reflective coating 53 include but are not limited to silver, gold, chromium and tin. Alternatively, multiple layers of one or more dielectric materials such as silicon dioxide, for example, can be deposited on the angled surface 22 to form the reflective coating 53. For example, reflective coating 53 can be created by treating the angled surface 22 with a single layer of gold or silver that is preferably mixed with chromium to form reflective coating 53. The thickness of reflective coating 53 varies depending upon the particular implementation, with a thicker coating causing more photons from the light source 12 to reflect.

The transmitted light beam 34 is reflected from the reflective coating 53 deposited on the angle surface 22 of the proximal end 21 of the second substrate 14 to define the reflected light beam 51. The device 50 is configured so that the reflected light beam 51 impinges on a light source detector 31 housed in the same surface as the light source 12, the third substrate 16. The light source detector 31 (which can also be referred to as a "power monitor" inasmuch as light intensity is proportional to the power of the light) provides a signal 35 that is proportional to the number of photons impinging upon the face of the light source detector 31.

The maximum dimension d (i.e., the diameter of the major axis) of the size of the reflected light beam 51 that impinges on light source detector 31 is given by the following equation;

$$d = 2\tan(\zeta)\left\{h + (h+L)\tan\left(\frac{1}{2}\tan^{-1}\left(\frac{s}{h}\right)\right)\left[\frac{2-\left(\frac{s}{h}\right)^2\tan^2\left(\frac{1}{2}\tan^{-1}\left(\frac{s}{h}\right)\right)}{1-\left(\frac{s}{h}\right)^2\tan^2(\zeta)}\right]\right\}$$

where s is the distance between the light source 12 and light source detector 31, h is the distance between the point of contact 52 on the angled surface 22 and the light source 12, and $\zeta$ is half of the angle of the light source 12 emission cone. The size of the reflected light beam 51 that impinges upon the light source detector 31 should be completely within the light source detector 31 to avoid overfill, and shadowing.

In a preferred embodiment, signal 35 is an electrical signal. An example of an light source detector 31 suitable for use in the context of the invention can comprise a semiconductor detector, preferably a p-n photodiode detector (Honeywell, Inc. Freeport Ill., USA), although virtually any light source detector that is responsive to the type of light produced by light source 12 could be used.

For some light source applications, faster response time is preferred. The response time of a light source detector fabricated with a homogeneous substrate is limited by transit time and/or the RC (resistor-capacitor) time constant. The response time can be substantially improved by the use of an epitaxial or wafer bond substrate.

Figure 4:
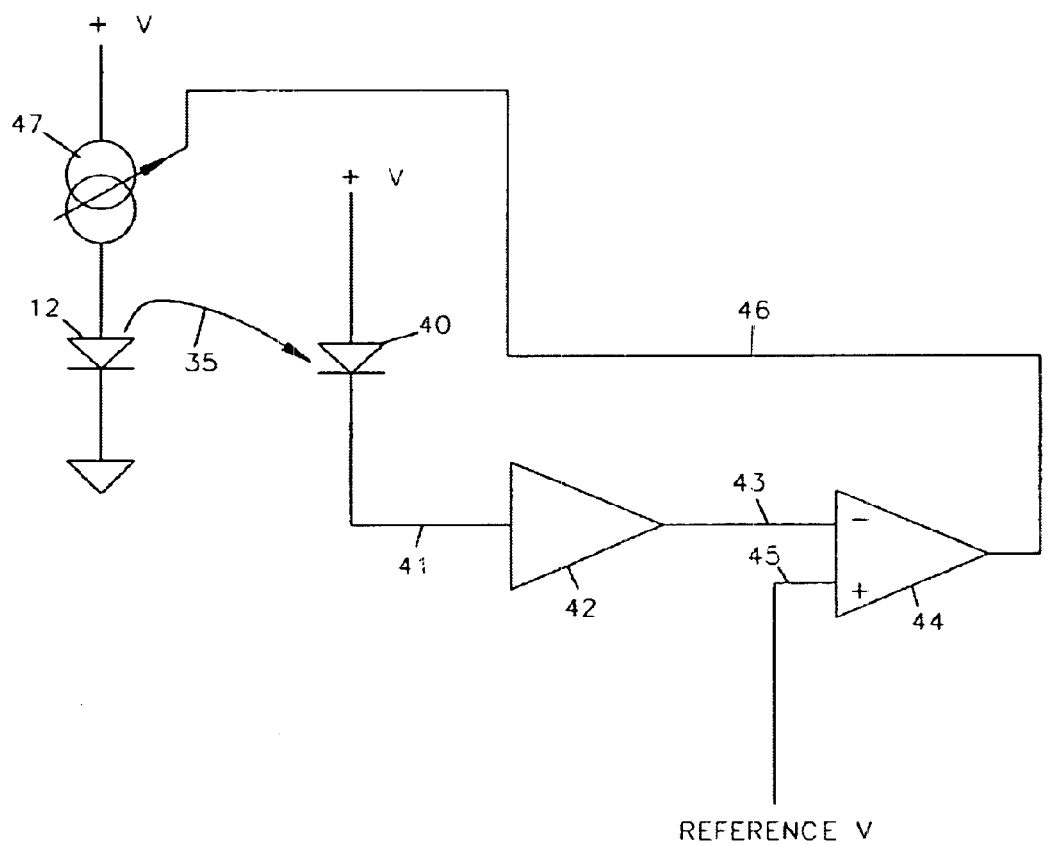
FIG. 4 is a cross-sectional view of a second exemplary embodiment of the invention that houses the detector on the substrate adjacent to the light source.

The signal 35 is utilized to determine the intensity of the power output from the light source 12 and to control the power output from the light source 12. The device tracks the signal 35 and the light source 12 whose power output correlates with the signal 35. This can be done, for example, by using the schematic depicted in FIG. 4. Diode 40 senses the received signal 35 that correlates to the output power of light source 12 and converts it into a transmitted signal 41. The transmitted signal 41 is amplified or buffered by amplifier 42 into amplified signal 43, which goes into the inverting input of differential amplifier 44. A reference voltage signal 45 goes to the noninverting input of differential amplifier 44. The output of differential amplifier 44 is a feedback signal 46 that goes to variable current source 47 that adjusts the amount of current to the light source 12 to control the output as defined by the signal 35 of light source 12 in accordance with feedback signal 46. The geometric pattern of the laser output varies with power output as defined by the signal 35, such that the ratio of the feedback signal 46 to the transmitted signal 41 is not constant as a function of power or intensity of signal 35.

Devices in accordance with the invention can also be included in one- two- or three-dimensional arrays of the devices. Preferably, the devices are housed within an array of the devices.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A device to monitor light output from a light source, comprising:
    a substantially V-groove assembly comprising a first and a second substrate, wherein said second substrate extends outwardly beyond the surface of said first substrate, and wherein said second substrate has a reflective coating deposited thereon;
    a wave guide structure positioned in said V-groove assembly;
    a light source positioned in communication with said wave guide structure and positioned so that an amount of light emitted from said light source, which is less than 100%, enters said wave guide structure; and
    a light detector positioned so that at least some of the light emitted from said light source, that did not enter said wave guide structure impinges upon the light detector.

2. The device of claim 1, wherein said second substrate is configured with an angled surface where the reflective coating is deposited.

3. The device of claim 2, wherein said angled surface of said second substrate is positioned over said wave guide structure.

4. The device of claim 1, wherein said light source is a laser.

5. The device of claim 4, wherein said laser is an edge emitting laser or a vertical cavity surface emitting laser.

6. The device of claim 1, wherein said wave guide structure is an optical fiber.

7. The device of claim 1, wherein said wave guide structure is a polymer-based wave guide.

8. The device of claim 6, wherein said optical fiber comprises optical glass or optical plastic.

9. The device of claim 6, wherein said optical fiber is single-mode or multi-mode.

10. The device of claim 6, wherein said optical fiber comprises an inner core and an outer cladding.

11. The device of claim 10, wherein said inner core has an index of refraction higher than that of said outer cladding.

12. The device of claim 1, wherein said reflective coating is chosen from the group consisting of: silver, gold, chromium, tin, or combinations thereof.

13. The device of claim 12, wherein said reflective coating comprises gold, silver, chromium and combinations thereof.

14. The device of claim 13, wherein said reflective coating comprises gold or silver and chromium.

15. The device of claim 1, wherein said reflective coating comprises multiple layers.

16. The device of claim 15, wherein said multiple layers comprise dielectric materials.

17. The device of claim 16, wherein said dielectric materials comprise silicon dioxide.

18. A device to monitor light output from a laser, comprising:
- a laser that emits light normal to the surface of the laser;
- a wave guide positioned adjacent said laser and over a light path of said laser;
- a reflective surface positioned adjacent said laser and in the light path of said laser; and
- a light detector positioned adjacent said laser and in the light path of said reflective surface, wherein said reflective surface, said laser, said light detector and said wave guide are positioned so that an amount of light emitted from said laser, which is less than 100%, enters said wave guide; and at least some of the light emitted from said laser that did not enter said wave guide reflects from said reflective surface and impinges upon said light detector.

19. The device of claim 18, wherein said wave guide structure is an optical fiber.

20. The device of claim 19, wherein said optical fiber comprises optical glass or optical plastic.

21. The device of claim 19, wherein said optical fiber is single-mode or multi-mode.

22. The device of claim 19, wherein said optical fiber comprises an inner core and an outer cladding.

23. The device of claim 22, wherein said inner core has an index of refraction higher than that of said outer cladding.

24. The device of claim 18, wherein said reflective surface comprises: silver, gold, chromium, tin, or combinations thereof.

25. The device of claim 24, wherein said reflective surface comprises gold, silver, chromium and combinations thereof.

26. The device of claim 25, wherein said reflective surface comprises gold or silver and chromium.

27. The device of claim 18, wherein said reflective surface comprises multiple layers.

28. The device of claim 27, wherein said multiple layers comprise dielectric materials.

29. The device of claim 28, wherein said dielectric material comprises silicon dioxide.

30. A method of producing a device comprising the steps of:
- coating a surface of a second substrate, with a reflective material wherein said second substrate is part of a substantially V groove assembly that comprises a first and a second substrate, wherein said second substrate extends outwardly beyond the surface of said first substrate;
- placing a light source in communication with said V-groove assembly;
- placing a light detector in communication with said V-groove assembly; and
- placing a wave guide structure in said V-groove assembly;
- wherein said reflective material, said light source, said detector and said wave guide structure are positioned so that an amount of light emitted from said light source, which is less than 100%, enters said wave guide structure; and at least some of the light emitted from said light source that did not enter said wave guide structure reflects from said reflective material and impinges upon said light detector.

31. The method of claim 30, wherein said wave guide structure is positioned over said light source, and said reflective coating is positioned over said wave guide structure.

32. The method of claim 30, wherein said light source emits light normal to its surface.

33. The method of claim 30, wherein said reflective material comprises: silver, gold, chromium, tin, or combinations thereof.

34. The method of claim 33, wherein said reflective surface comprises gold, silver, chromium and combinations thereof.

35. The method of claim 34, wherein said reflective surface comprises gold or silver and chromium.

36. The method of claim 30, wherein said reflective surface comprises multiple layers.

37. The method of claim 36, wherein said multiple layers comprise dielectric materials.

38. The method of claim 37, wherein said dielectric material comprises silicon dioxide.

39. The method of claim 30, wherein said wave guide structure is an optical fiber.

40. The method of claim 39, wherein said optical fiber comprises optical glass or optical plastic.

41. The method of claim 39, wherein said optical fiber is single-mode or multi-mode.

42. The method of claim 39, wherein said optical fiber comprises an inner core and an outer cladding.

43. The method of claim 42, wherein said inner core has an index of refraction higher than that of said outer cladding.

44. The device produced by the method of claim 30.

45. The device produced by the method of claim 31.

* * * * *